(12) United States Patent
Treigherman et al.

(10) Patent No.: US 8,103,944 B2
(45) Date of Patent: Jan. 24, 2012

(54) MEMORY ARCHITECTURE FOR HIGH THROUGHPUT RS DECODING FOR MEDIAFLO RECEIVERS

(75) Inventors: Philip Treigherman, Newport Beach, CA (US); Chaoliang T. Chen, Irvine, CA (US)

(73) Assignee: Newport Media, Inc., Lake Forest, CA (US)

( * ) Notice: Subject to any disclaimer, the term of this patent is extended or adjusted under 35 U.S.C. 154(b) by 905 days.

(21) Appl. No.: 12/131,400

(22) Filed: Jun. 2, 2008

(65) Prior Publication Data

US 2009/0300470 A1 Dec. 3, 2009

(51) Int. Cl.
*H03M 13/00* (2006.01)
(52) U.S. Cl. .................................................. 714/784
(58) Field of Classification Search .................. 714/701, 714/746, 784, 786; 370/210, 469
See application file for complete search history.

(56) References Cited

U.S. PATENT DOCUMENTS

| | | | |
|---|---|---|---|
| 7,646,774 B2 * | 1/2010 | Kim et al. | 370/395.64 |
| 7,782,903 B2 * | 8/2010 | Yousef | 370/469 |
| 7,821,916 B2 * | 10/2010 | Yousef | 370/210 |
| 2009/0046816 A1 * | 2/2009 | Hong et al. | 375/340 |

* cited by examiner

*Primary Examiner* — Shelly A Chase
(74) *Attorney, Agent, or Firm* — Rahman LLC (57) ABSTRACT

A system and method for increasing the throughput of a RS decoder in MediaFLO™ receivers. A MAC de-interleaver RAM architecture allowing operation of parallel RS decoders comprises of four equal portioned memory banks, a codeword buffer for data correction, and a higher bit width RAM. The method of increasing throughput of RS decoder by minimizing RAM access and clock frequency includes increasing the bit width of the de-interleaver RAM, using parallel RS decoder cores for decoding received data, partitioning a 4-bank RAM and ECB allocation scheme, and correcting the data using intermediate buffers. The architecture enables on-chip implementation of the MAC de-interleaver RAM and RS decoders with reduced power consumption and provide higher RS decoder throughput.

20 Claims, 7 Drawing Sheets

MEMORY ARCHITECTURE FOR HIGH THROUGHPUT RS DECODING FOR MEDIAFLO RECEIVERS

BACKGROUND

1. Technical Field

The embodiments herein generally relate to communication systems, and, more particularly, to the field of memory architectures in orthogonal frequency division multiplexing (OFDM) systems.

2. Description of the Related Art

A Media forward link only (MediaFLO™) system, available from Qualcomm, Inc., California, USA, is a system of broadcasting data to handheld devices where data transmission is from the transmitter to handheld device. In MediaFLO™ devices transmission is performed in superframes, each superframe containing 1,200 orthogonal frequency division multiplexing OFDM symbols carrying multiple media channels called Multicast Logical Channels (MLC). Each MLC contains a number of Reed-Solomon (RS) error control blocks (ECB).

The MediaFLO™ device receiver's media access control (MAC) de-interleaver random access memory (RAM) uses a RS decoder to decode data in the outer code, a turbo decoder to decode data in the inner code, and a de-interleaver to recover the transmitted data packets to combat burst errors found in signal due to channel noise.

There is a frequent arbitration between the RS decoder and clients' read/write accesses. Many memory architectures make use of multiple-port RAMs to ease the arbitration process which leads to larger RAM area and power consumption. Due to the large amount of MLC data, the RAM size increases and hence the power consumption increases as well. Off-chip implementations where the MAC de-interleaver RAM and RS decoders (demodulator) are implemented separately lead to greater power consumption due to switching of signals between the MAC de-interleaver RAM chip and demodulator chip. Hence, it would be desirable to have on chip implementation of the MAC de-interleaver RAM and RS decoders with reduced power consumption and higher RS decoder throughput.

SUMMARY

In view of the foregoing, an embodiment herein provides a system for increasing the throughput of RS decoders in a MediaFLO™ receiver comprises of parallel RS decoder cores decoding received data and a single port RAM for accessing the de-interleaver RAM, wherein the number of parallel RS decoders is equaled to a ceiling (16 ms/ (122*floor (b/122/6)*r*t), where b is the size of the de-interleaver RAM in bytes, t is the clock period of the system, r is the RS decoder throughput in clock cycles per codeword, 16 is the size of RS codeword, and 122 is the number of codewords in an error control block (ECB), which is the same as the number of bytes in one MAC packet.

Another embodiment provides a MAC de-interleaver RAM architecture in a MediaFLO™ receiver that allows operation of parallel RS decoders for higher throughput and comprises of four equal partitioned memory banks, and a codeword buffer for data correction and a higher bit width RAM.

In another embodiment, the single port for RAM allows arbitration free access of RS decoder cores and MAC de-interleaver RAM. Moreover, each partitioned memory bank may correspond to one frame of data and the higher data bit width of RAM allows simultaneous processing of data in parallel RS decoders and reduces the memory access by a factor equal to the number of parallel RS decoder cores.

Furthermore, the RS decoder has a codeword size of 16 bytes and the number of RS decoders required is in the range from 2 to 8 and the number of RS decoders are calculated using a clock frequency, the total interleaver RAM size, and the RS decoder core throughput.

Another embodiment provides a method of increasing the throughput of the RS decoder in a MAC de-interleaver RAM architecture of a MediaFLO™ receiver comprising of RS decoders and codeword buffers, wherein the method comprises increasing a bit width of the de-interleaver RAM; using parallel RS decoder cores for decoding received data; partitioning the de-interleaver RAM into equal sections for parallel processing of RS codewords; and using small codeword buffers instead of the main RAM as intermediate storage for data correction.

The de-interleaver RAM may be portioned into four equal RAM banks and the parallel RS decoders process RS codeword data simultaneously from a received superframe. Additionally, the codeword buffer preferably performs data correction without accessing the de-interleaver RAM, where the codeword buffer is implemented as RAM or as flip-flops. Preferably, the codeword buffer enables parallel RS decoder operation and the codeword buffers are duplicated, maximized in size, and clocked at twice the clock rate of the RAM to achieve maximum RS decoder throughput.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein achieve an on-chip implementation of the MAC de-interleaver RAM and RS decoder with reduced power consumption and increased RS decoder throughput by using parallel RS decoders, increasing the RAM bit width, and partitioning the de-interleaver RAM into equal RAM banks and using intermediate codeword buffers. Referring now to the drawings, and more particularly to FIGS. 1 through 8, where similar reference characters denote corresponding features consistently throughout the figures, there are shown preferred embodiments.

Figure 1:
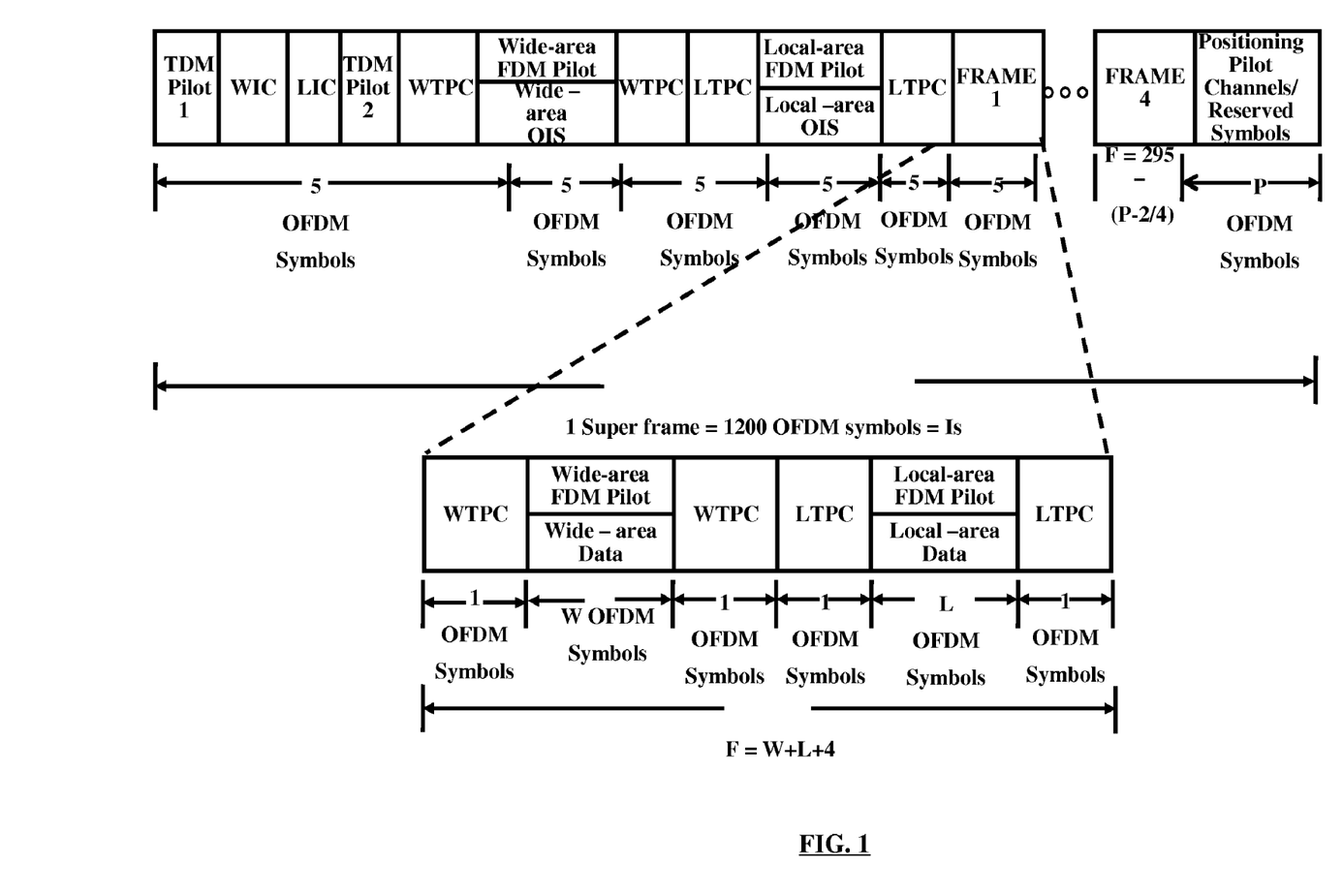
FIG. 1 illustrates a MAC layer of one superframe in a MediaFLO™ device used in accordance with the embodiments herein.

FIG. 1 illustrates a MAC layer of one superframe in Media-FLO™ devices. OFDM symbols are used by four data frames. The superframe transmits many MLCs and each MLC occupies a small fraction of the frame. The separation of four sections of each MLC in the time domain and the interleaving algorithm make the received signal more immune to burst noise and fading interference due to increased probability of data recovery by RS decoder. In a MediaFLO™ receiver, each MLC is received as a sequence of MAC packets (MPs) and each MP is defined as 122 consecutive bytes at the MAC layer. The MLC is organized into a whole number of RS ECBs, where each ECB contains 16 MPs and the total number of MPs per MLC is always divisible by 16.

Figure 2:
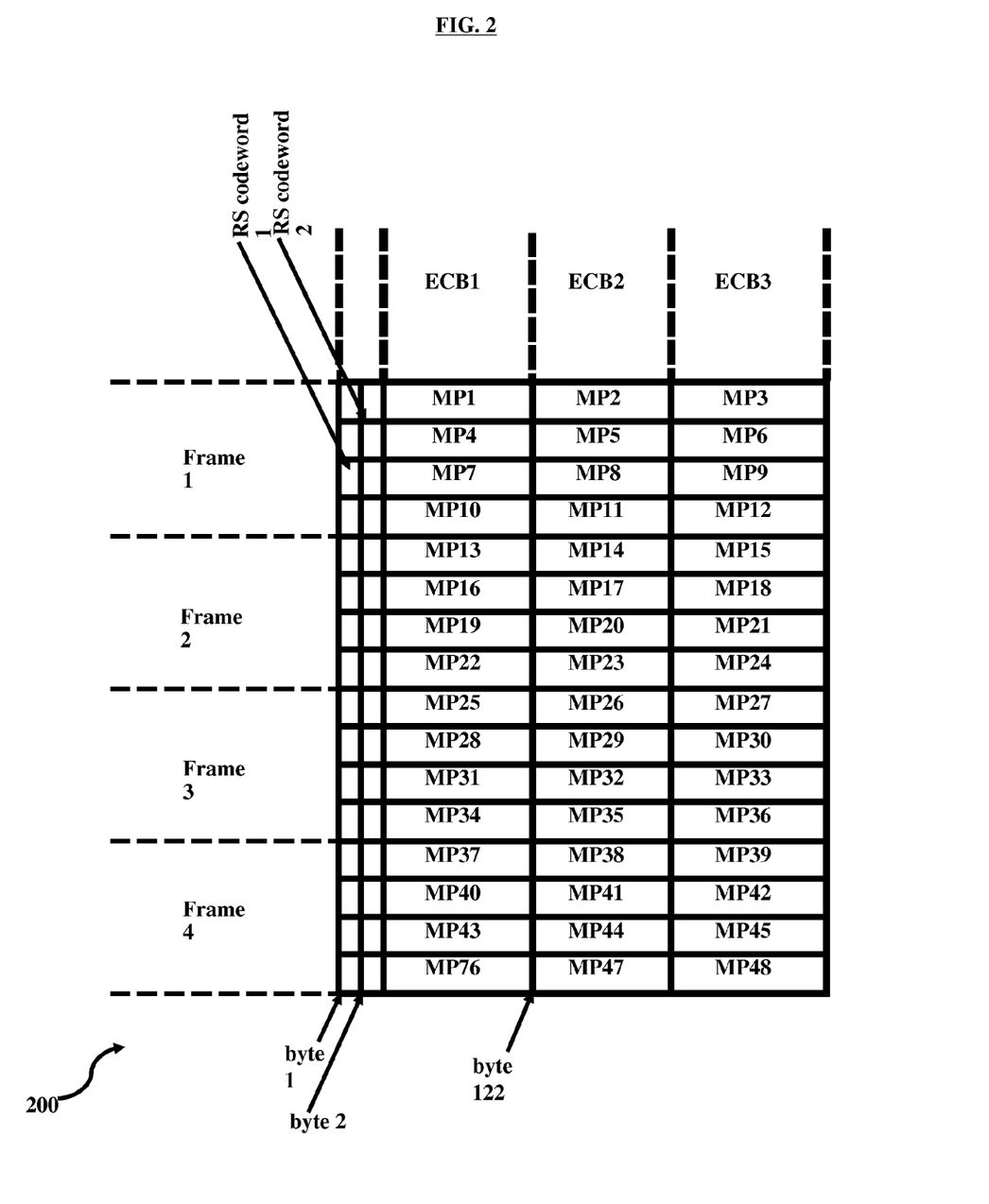
FIG. 2 illustrates a MAC de-interleaver ECB used in accordance with the embodiments herein.

FIG. 2 illustrates a MAC de-interleaver ECB 200. A MAC layer processor (not shown) constructs the ECB table by saving received MPs in row-wise order, and the number of columns already known to the MAC layer processor. The RS decoder decodes each ECB in column-wise order. The size of the RS codeword in the MediaFLO™ system is 16 bytes and processing of each ECB requires RS decoding of 122 codewords. The MLC data is streamed out in row-wise order after RS decoding of all the ECBs in the MLC is complete.

Figure 3:
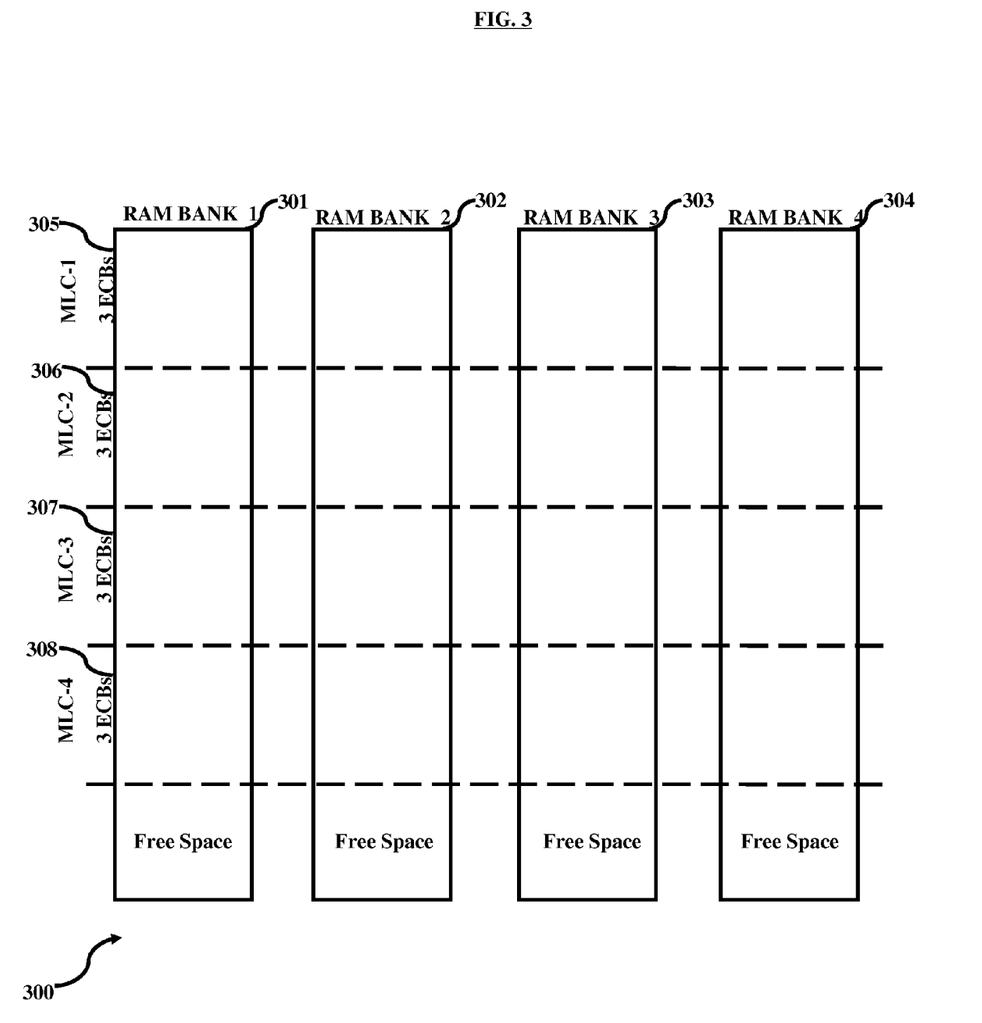
FIG. 3 illustrates an example of RAM partitioning and error control block allocation in the de-interleaver RAM used in accordance with the embodiments herein.

FIG. 3 illustrates an example of RAM partitioning and error control block allocation in a de-interleaver RAM 300. FIG. 3 illustrates three ECBs for each of the four MLCs, however the number of ECBs is not necessarily three, it can be any arbitrary number, decided by the transmitter. The MAC de-interleaver RAM 300 is partitioned into four equal banks: RAM bank 1 301, RAM bank 2 302, RAM bank 3 304, and RAM bank 4 304. Each bank corresponds to one frame of data. Four MLCs: MLC-1 305, MLC-2 306, MLC-3 307 and MLC 4—305 are allocated in the RAM banks 301-304. The MPs for each MLC is written to the RAM 300 within each frame of the superframe (of FIG. 1) in the order received from a turbo decoder (not shown). Each MLC is organized into a number of RS ECBs, where each ECB contains 16 MPs and the total number of MPs per MLC is divisible by 16.

Figure 4:
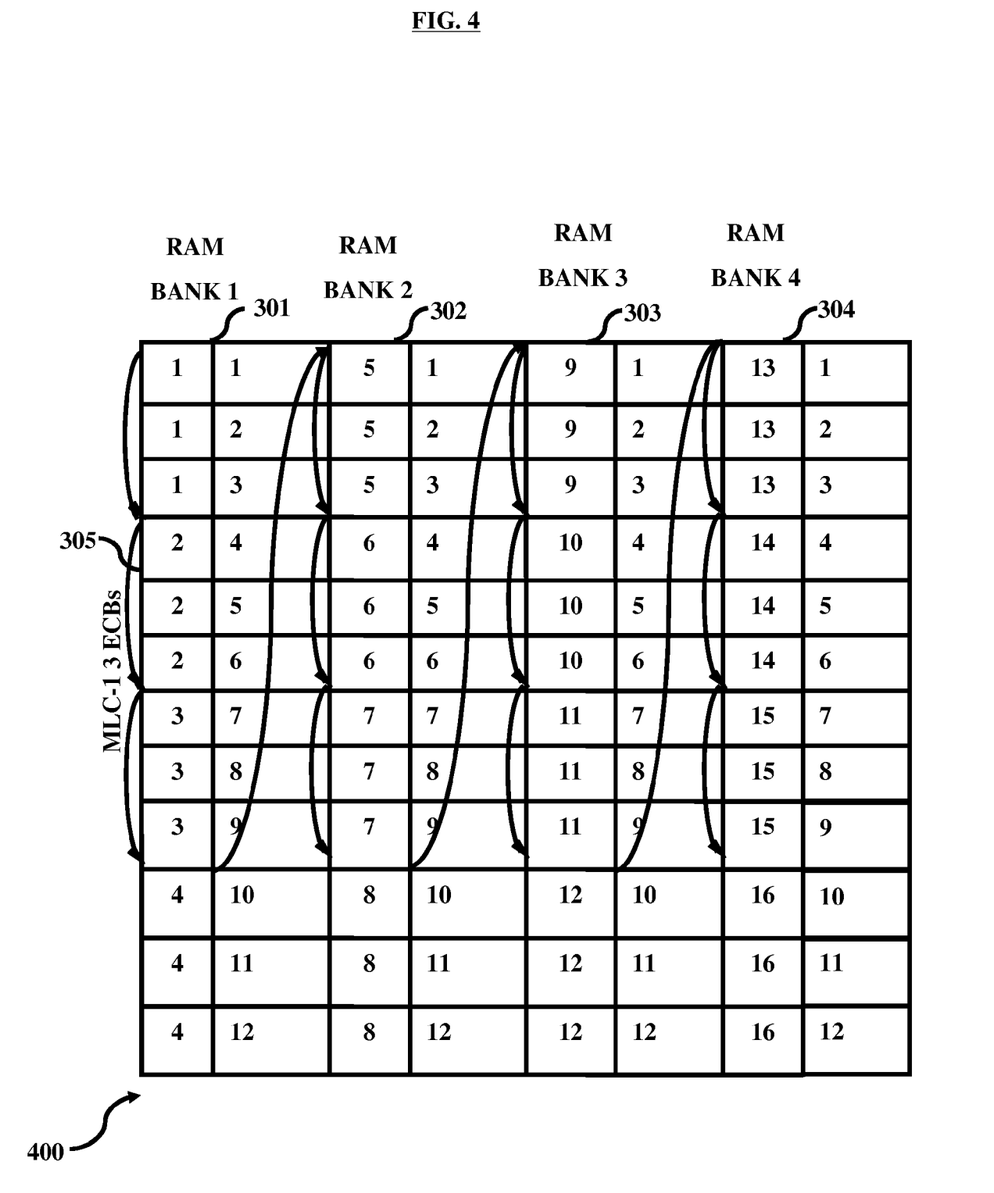
FIG. 4 illustrates the MAC layer packets (MP) order in a single ECB of an de-interleaver RAM according to the embodiments herein.

FIG. 4 illustrates the MP order in a single ECB 400 of a de-interleaver RAM 300 (of FIG. 3). In each frame of the superframe (of FIG. 1), the MPs of each MLC are written to the RAM banks 301-304 in the same order from the turbo decoder (not shown). The order creates ECB allocation which has identical order of MPs within ECBs in each RAM memory bank 301-304 and identical intra-bank address offsets for corresponding MPs. The arrows in FIG. 4 show the order of MPs of one ECB 400. The parallel RS decoder architecture simultaneously process "d" neighboring codewords in an ECB. If d=2, the RAM data width=16 bits and the first RS decoder iteration codewords 1 and 2 are decoded in parallel followed by codewords 3 and 4 in the second iteration until ECB decoding is complete in the $61^{st}$ iteration by processing codewords 121 and 122. The 4-band RAM partition and convenient MP start and end address alignment lead to a simple process to calculate the RAM address and ECB decoding pipeline design. The address jumps between two consecutive bytes within the same codeword are calculated by adding the MP size and the number of ECBs in the current MLC. If d is greater than 2, then padding bytes are added to the RAM at the end of each MP, so that the total MP size is divisible by 4. The ECB allocation scheme simplifies RAM address calculation for RS decoding read and write access and sets the stage for increasing the RAM data width to reduce memory access and clock frequency.

Figure 5:
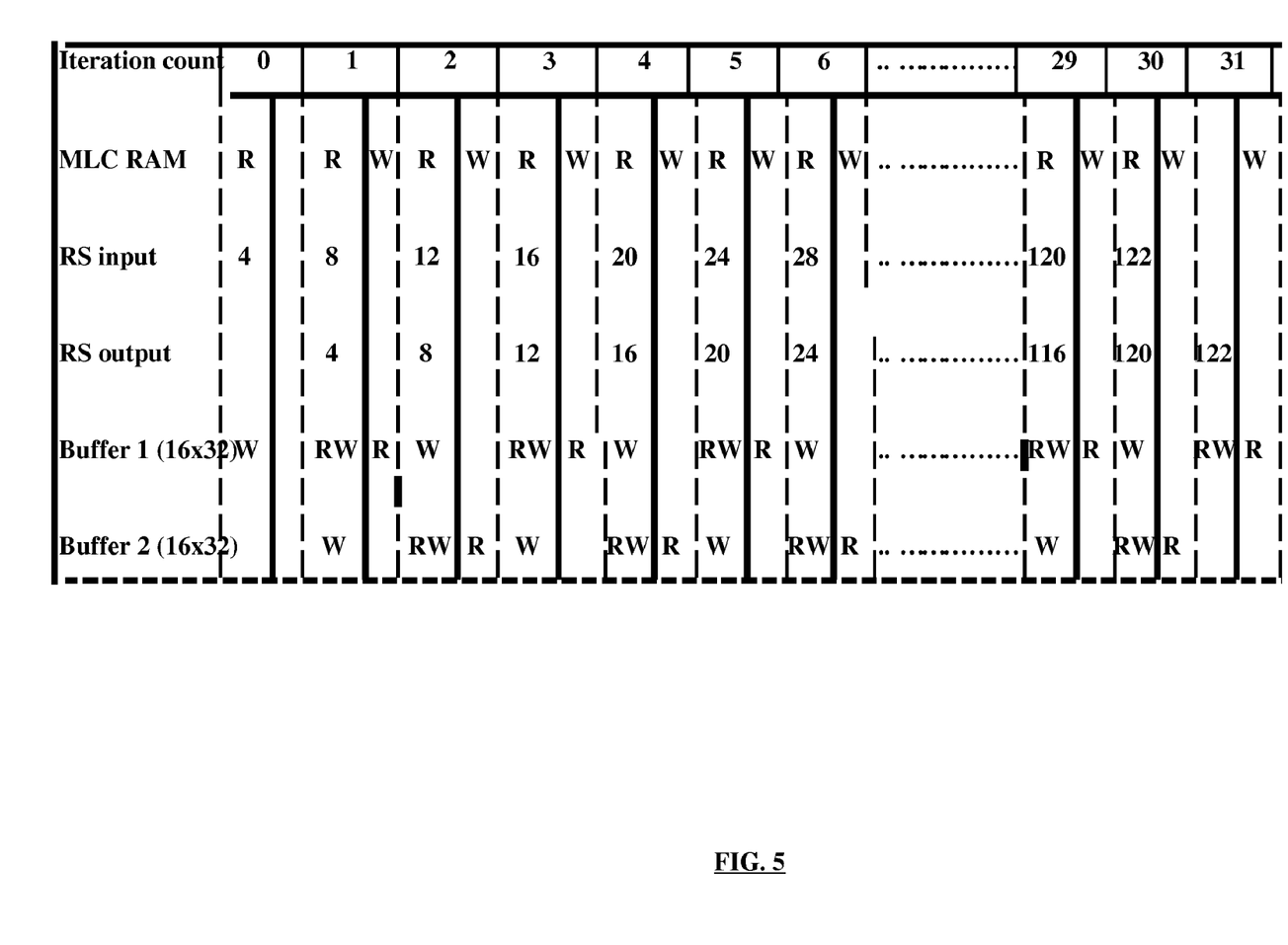
FIG. 5 illustrates an example of RS decoding of one ECB using four RS decoders used in accordance with the embodiments herein.

FIG. 5 illustrates an example of RS decoding of one ECB 400 (of FIG. 4) using four RS decoders used in accordance with the embodiments herein. In FIG. 5, the RS decoder input in each iteration is represented by four parallel codewords. That is why in iteration 0 the input is codewords 1-4, in iteration 1 the input is codewords 5-8, and so on. The output codewords are delayed by one iteration. The RS decoder core throughput is 35 cycles per 16-byte codeword. The number of iterations required to decode one ECB is 122/4=31. Each codeword buffer is a 16×32 memory holding four parallel codewords. The buffer1 and buffer 2 uses a clock that is twice as fast as the clock used by de-interleaver MLC RAM 300 (of FIG. 3). The duration of each iteration is 35 cycles which is same as the throughput of one RS decoder. The first half of each iteration is used for de-interleaver RAM read access and the second half is used for write access. The two codeword buffers alternate between two different access patterns every two iterations. The error correction is completed by the RS decoding process of the RS decoder and the RS decoder outputs an error correction completion signal.

Figure 6:
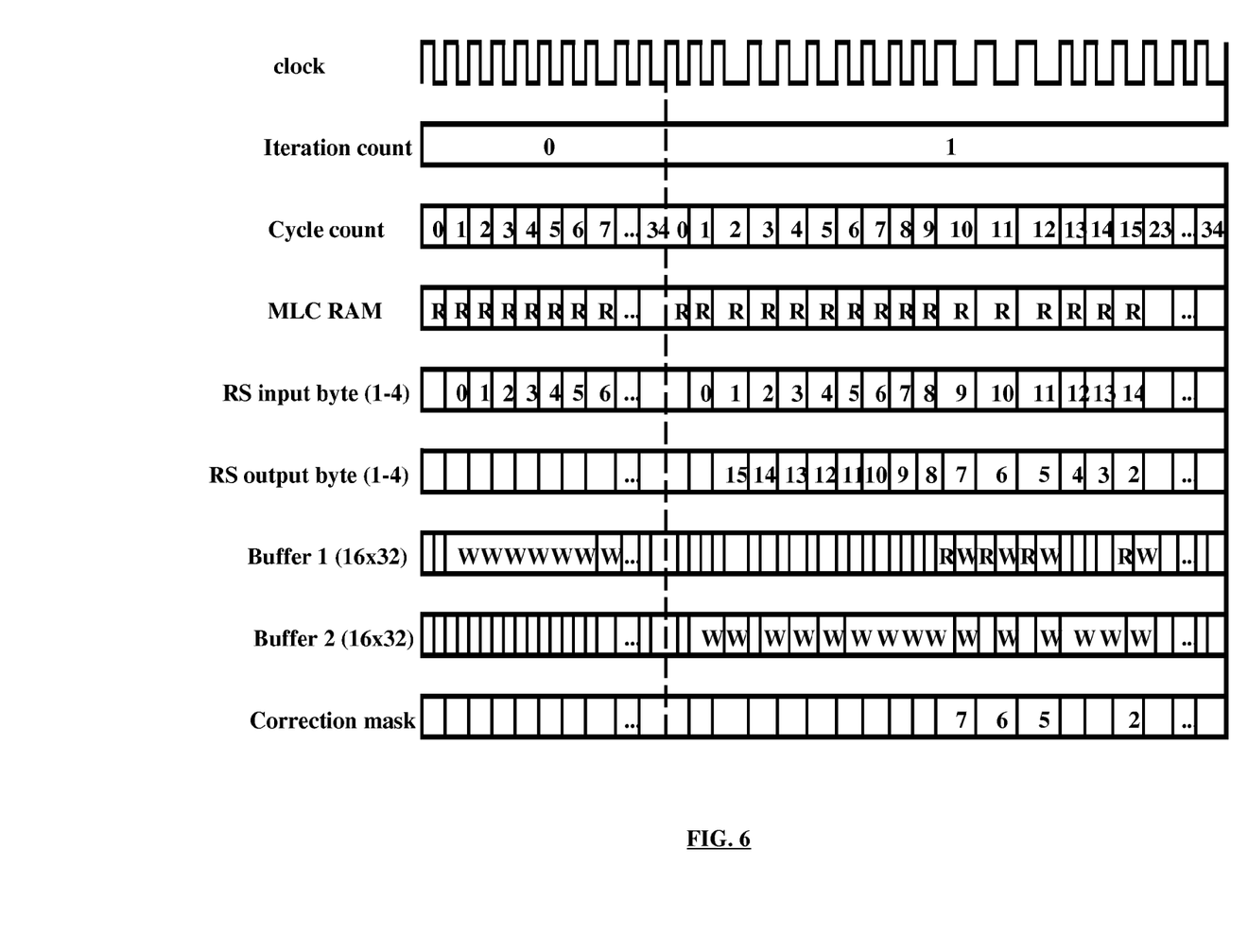
FIG. 6 illustrates a detailed view of two iterations in a RS decoder in accordance with the embodiments herein.

FIG. 6 illustrates a detailed view of two iterations in a RS decoder in accordance with the embodiments herein. The duration of each iteration is 35 cycles. The two codeword buffers (buffer 1 (16×32) and buffer 2 (16×32)) alternate between two different access patterns in every two iterations. When iteration is 0, buffer 1 (16×32) is written to save the incoming four codewords that are read from the MLC RAM 300 (of FIG. 3). When iteration=1, the buffer is first read to perform data corrections, and then the corrected data is written back and finally all 4 corrected codewords are read from buffer 1 and written to the de-interleaver RAM. Buffer 2 has same access pattern starting in odd iterations and hence the function of buffer 2 is opposite of buffer 1. The correction mask marks the codeword byte locations that need to be corrected. The codeword buffers are implemented as RAM or as flip-flops. Intermediate code buffering is performed for data correction without accessing the main RAM. One buffer should hold the complete codewords that are currently processed by the RS decoders. The MAC de-interleaver RAM 300 (of FIG. 3) access is minimized if each decoding iteration performs only 16 read and 16 write accesses to the RAM 300.

Figure 7:
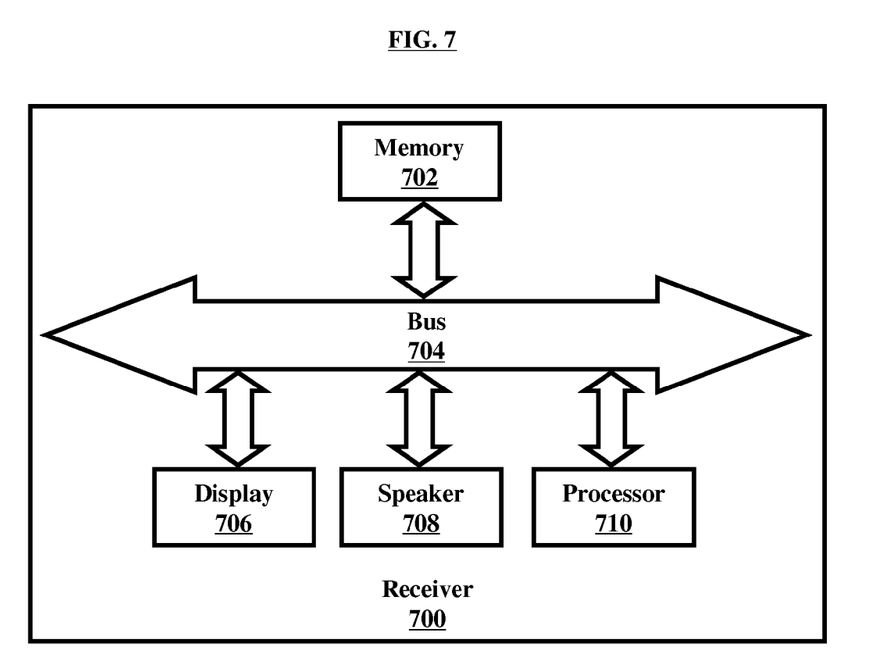
FIG. 7 is a schematic diagram of a receiver according to an embodiment herein.

FIG. 7 illustrates a schematic diagram of a receiver 700 having an a memory 702 having a computer set of instructions, a bus 704, a display 706, a speaker 708, and a processor 710 capable of processing a set of instructions to perform any one or more of the methodologies herein, according to an embodiment herein. The processor 710 may also enable digital content to be consumed in the form of video for output via one or more displays 706 or audio for output via speaker and/or earphones 708. The processor 710 may also carry out the methods described herein and in accordance with the embodiments herein.

Digital content may also be stored in the memory 702 for future processing or consumption. The memory 702 may also store program specific information and/or service information (PSI/SI), including information about digital content (e.g., the detected information bits) available in the future or stored from the past. A user of the receiver 700 may view this stored information on display 706 and select an item of for viewing, listening, or other uses via input, which may take the form of keypad, scroll, or other input device(s) or combinations thereof. When digital content is selected, the processor 710 may pass information. The content and PSI/SI may be passed among functions within the receiver 700 using bus 704.

Figure 8:
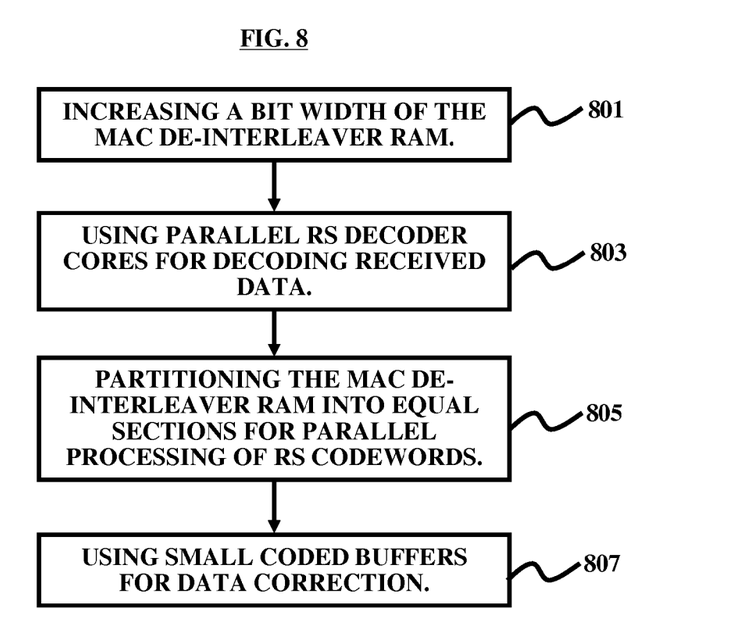
FIG. 8 is a flow diagram illustrating a method according to the embodiments herein.

FIG. 8, with reference to FIGS. 1 through 7, is a flow diagram illustrating a method of increasing a throughput of a RS decoder in a MAC de-interleaver RAM architecture 300 of a MediaFLO™ receiver 700 comprising of RS decoders and codeword buffers, the method comprising increasing (801) a bit width of the MAC de-interleaver RAM 300; using (803) parallel RS decoder cores for decoding received data; partitioning (805) the MAC de-interleaver RAM 300 into equal sections for parallel processing of RS codewords; and using (807) small codeword buffers for data correction. The MAC de-interleaver RAM 300 is portioned into at least four equal RAM banks 301-304. The parallel RS decoders process RS codeword data simultaneously from a received superframe (of FIG. 1). The codeword buffers perform data correction without accessing the MAC de-interleaver RAM 300. The codeword buffers enable a parallel RS decoder operation. The codeword buffers are duplicated to attain maximum RS decoder throughput. The size of the codeword buffers is maximized to attain a maximum RS decoder throughput.

The embodiments herein provide a method to reduce the frequency of RAM access by increasing the RAM data width. The memory is read only once to input the current byte of an RS codeword simultaneously to all parallel decoders and also the memory is written only once to save the corrected codeword byte simultaneously from all the parallel decoders. The memory access is reduced by a factor equal to the number of parallel RS decoder cores. The embodiments herein also provide methods to achieve maximum RS decoding throughput by duplicating the intermediate codeword buffers, increasing the size of the buffers, and clocked using a faster clock or a combination of the processes. The embodiments herein further provide a cost-effective method to implement the MAC de-interleaver RAM 300 on-chip.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips is distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product is any product that includes integrated circuit chips, ranging from toys and other low-end applications to advanced computer products having a display, a keyboard or other input device, and a central processor.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A Reed-Solomon (RS) decoding engine in a memory architecture of a media access control (MAC) de-interleaver random access memory (RAM) that increases a throughput of RS decoders in a MediaFLO™ (forward link only) receiver, the architecture comprising:

parallel RS decoder cores comprising a RS decoder that decodes received data, wherein the number of parallel RS decoders equals a ceiling 16 ms/(122*floor (b/122/6)*r*t), wherein b is the size of a de-interleaver RAM in bytes, t is a clock period, r is a RS decoder core throughput in clock cycles per codeword, 16 is a size of a RS codeword, and 122 is the number of codewords in one error control block (ECB), wherein said number of codewords is equal to the number of bytes in one MAC packet; and a single port RAM for accessing said de-interleaver RAM.

2. The architecture of claim 1, wherein said single port for RAM allows arbitration free access of said RS decoder cores and said MAC de-interleaver RAM.

3. The architecture of claim 1, wherein said RS decoder has a codeword size of 16 bytes.

4. The architecture of claim 1, wherein the number of RS decoders is in the range from 2 to 8.

5. The architecture of claim 1, wherein the number of said RS decoders is calculated using:

clock frequency;

total interleaver RAM size; and

RS decoder core throughput.

6. A media access control (MAC) de-interleaver random access memory (RAM) architecture in a MediaFLO™ (forward link only) receiver allowing operation of parallel Reed-Solomon (RS) decoders for higher throughput, the architecture comprising:
   four equal partitioned memory banks;
   a codeword buffer for data correction; and
   a high bit width RAM.

7. The architecture of claim 6, wherein each of said partitioned memory banks correspond to one frame of data.

8. The architecture of claim 6, wherein said high data bit width of RAM allows simultaneous processing of data in said parallel RS decoders.

9. The architecture of claim 6, wherein said high data width reduces the memory access by a factor equal to the number of parallel RS decoder cores.

10. The architecture of claim 6, further comprising a plurality of said codeword buffers.

11. The architecture of claim 6, wherein said codeword buffer comprises a RAM.

12. The architecture of claim 6, wherein said codeword buffer comprises flip-flops.

13. The architecture of claim 6, wherein said codeword buffer is clocked at twice the clock rate of said RAM.

14. A method of increasing a throughput of a Reed Solomon (RS) decoder in a media access control (MAC) de-interleaver random access memory (RAM) architecture of a MediaFLO™ receiver comprising of RS decoders and codeword buffers, said method comprising:
   increasing a bit width of said MAC de-interleaver RAM;
   using parallel RS decoder cores for decoding received data;
   partitioning said MAC de-interleaver RAM into equal sections for parallel processing of RS codewords; and
   using small codeword buffers for data correction.

15. The method of claim 14, wherein said MAC de-interleaver RAM is portioned into at least four equal RAM banks.

16. The method of claim 14, wherein said parallel RS decoders process RS codeword data simultaneously from a received superframe.

17. The method of claim 14, wherein said codeword buffer perform data correction without accessing said MAC de-interleaver RAM.

18. The method of claim 14, wherein said codeword buffers enable a parallel RS decoder operation.

19. The method of claim 14, wherein said codeword buffers are duplicated to attain maximum RS decoder throughput.

20. The method of claim 14, wherein a size of said codeword buffers is maximized to attain a maximum RS decoder throughput.

* * * * *